(12) United States Patent
Oh

(10) Patent No.: US 6,356,116 B1
(45) Date of Patent: Mar. 12, 2002

(54) APPARATUS AND METHOD FOR LOW SKEW CLOCK BUFFER CIRCUIT

(75) Inventor: Sung-Hun Oh, Sunnyvale, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/548,328

(22) Filed: Apr. 12, 2000

(51) Int. Cl.$^7$ ............................................. H03K 19/00
(52) U.S. Cl. ........................... 326/93; 326/101; 326/47
(58) Field of Search ............................. 326/93, 95, 47, 326/101; 327/297, 293, 295

(56) References Cited

U.S. PATENT DOCUMENTS

| | | | |
|---|---|---|---|
| 4,949,565 A | 8/1990 | Knecht et al. | 307/542 |
| 5,111,075 A | 5/1992 | Ferry et al. | 307/443 |
| 5,760,610 A | 6/1998 | Naffziger | 326/93 |
| 5,828,870 A | 10/1998 | Gunadisatra | 395/558 |
| 5,831,459 A | * 11/1998 | McDonald | 327/141 |
| 5,838,186 A | 11/1998 | Inoue et al. | 327/389 |
| 5,911,063 A | 6/1999 | Allen et al. | 395/555 |
| 5,923,188 A | 7/1999 | Kametani et al. | 326/93 |
| 6,025,740 A | * 2/2000 | Fukuyama | 326/93 |

OTHER PUBLICATIONS

Restle, et al., "Measurement and Modeling of On–Chip Transmission Line Effects in a 400 MHz Microprocessor", IEEE Journal of Solid–State Circuits, vol. 33, No. 4, Apr. 1998, pp. 662–665.

* cited by examiner

Primary Examiner—Michael Tokar
Assistant Examiner—Anh Q. Tran
(74) Attorney, Agent, or Firm—Thelen Reid & Priest LLP; David B. Ritchie

(57) ABSTRACT

A clock buffer circuit is disclosed. The clock buffer circuit is included in each sub-block of a clock distribution structure in an integrated circuit. Each clock buffer circuit comprises a plurality of driving inverters, and each clock buffer circuit presents an equal input load to the previous driver, regardless of the amount of load in the sub-block circuit. In each sub-block, the clock buffer circuit is connected to provide an output including the combined signals of a portion of the inverters. The portion is approximated by the load of the circuit in the sub-block divided by the load of the circuit in the sub-block having the greatest load of any sub-block. The outputs of inverters not connected to the load of the sub-block circuit are wired to power and ground terminals. Each driving inverter may comprise a pMOS FET paired with an nMOS FET. A method for designing such a clock buffer circuit is also disclosed.

15 Claims, 8 Drawing Sheets

APPARATUS AND METHOD FOR LOW SKEW CLOCK BUFFER CIRCUIT

CROSS-REFERENCE TO RELATED APPLICATION

The present application is related to the U.S. Patent Application entitled APPARATUS AND METHOD FOR LOW NOISE LOW SKEW CLOCK BUFFER CIRCUIT, filed on Apr. 12, 2000, in the name of inventor Sung-Hun Oh and commonly owned herewith.

BACKGROUND OF THE INVENTION

1. Field of the Invention

This invention relates to clock distribution in integrated circuits. In particular, this invention relates to providing a low skew clock signal using clock buffer circuits in sub-blocks of an integrated circuit.

2. The Background Art

In very large scale integrated circuits, every sub-block which constitutes the whole chip is synchronized to either the rising edge or the falling edge of a reference clock source. However, due to physical separation and differential loading of sub-blocks, transition edges may vary slightly between sub-blocks. This variation is called skew.

There are many techniques used to minimize skew. One clock distribution scheme, known as H-tree clock distribution, attempts to minimize skew by equalizing the distance between the origin of the clock signal and the various destination sub-blocks of the clock signal.

FIG. 1 is a schematic diagram showing an H-tree clock distribution scheme in accordance with the prior art. In the H-tree clock distribution scheme 10, a reference clock signal is applied at point 12. From point 12, the clock signal propagates to points 14 and 16. From point 14 the signal propagates to points 18 and 20, and from point 16 the signal propagates to points 22 and 24. Ideally, the clock signal reaches points 18, 20, 22 and 24 at the same time. If this is the case, then there is no skew.

The H-tree employs multiple layers, depending on the complexity of the chip. If another layer is desired, points 26, 28, 30, 32, 34, 36, 38, 40, 42, 44, 46, 48, 50, 52, 54 and 56 should receive the clock signal simultaneously. In the next layer, points 58, 60, 62, 64 and all other similarly situated points (not shown) should also receive the clock signal simultaneously.

At the end points of the clock tree, the circuits receiving the clock signals may differ in their impedance, or loading. These loading differences result in differing propagation delays along the branches of the tree, and result in skew. To balance loading, dummy loads may be implanted at receiving points or, alternatively, end point driving circuit sizes may be trimmed.

Balancing loading using existing methods has disadvantages. If imbalances are large, dummy loads may require excessive silicon real estate. Also, changing the circuit size at one end point by adding dummy loads or trimming the circuit size results in changing the relative loading at other equivalent end points. Thus, all equivalent end points may then require adjustment. When there are many end points, adjusting the loading at all end points is non-trivial.

SUMMARY OF THE INVENTION

A clock buffer circuit is disclosed. The clock buffer circuit is included in each sub-block of a clock distribution structure in an integrated circuit. Each clock buffer circuit comprises a plurality of driving inverters, and each clock buffer circuit presents an equal input load to the previous driver, regardless of the amount of load in the sub-block circuit. In each sub-block, the clock buffer circuit is connected to provide an output including the combined signals of a portion of the inverters. The portion is approximated by the load of the circuit in the sub-block divided by the load of the circuit in the sub-block having the greatest load of any sub-block. The outputs of inverters not connected to the load of the sub-block circuit are wired to power and ground terminals. Each driving inverter may comprise a pMOS FET paired with an nMOS FET. A method for designing such a clock buffer circuit is also disclosed.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons having the benefit of this disclosure.

Figure 1:
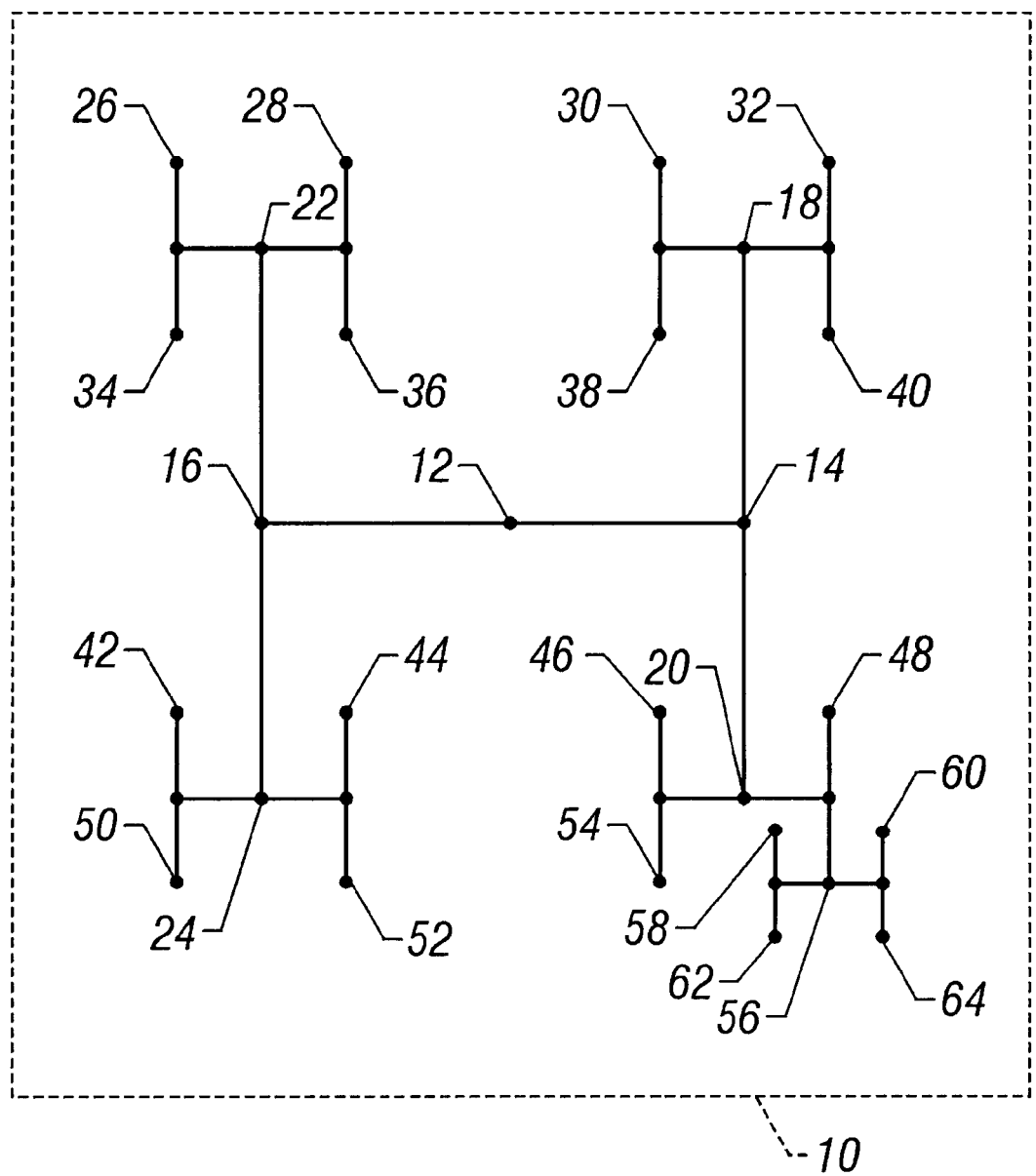
FIG. 1 is a schematic diagram showing an H-tree clock distribution scheme in accordance with the prior art.
Figure 2:
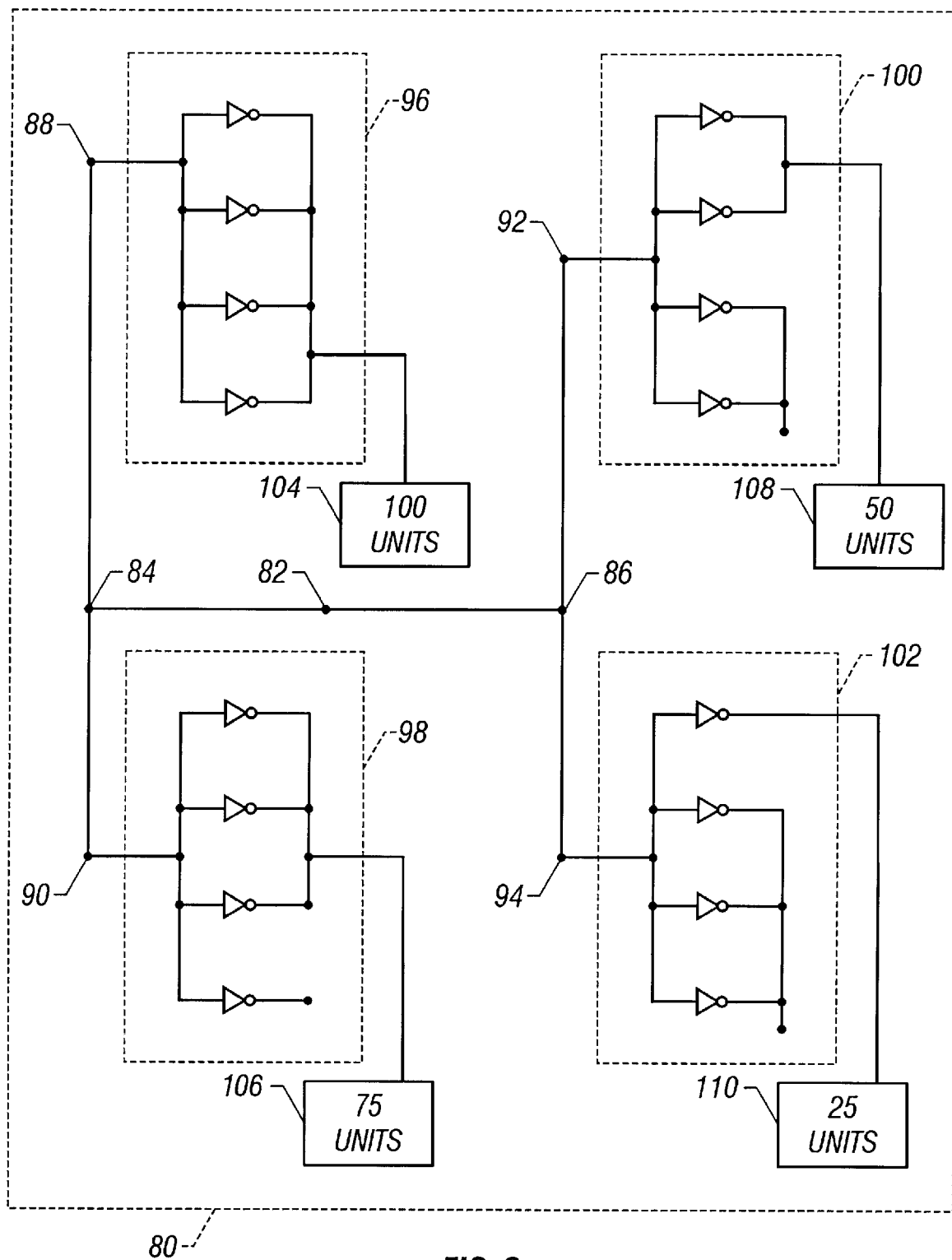
FIG. 2 is a schematic diagram of an H-tree clock distribution structure employing clock buffer circuits in accordance with a specific embodiment of the present invention.

FIG. 2 is a schematic diagram of an H-tree clock distribution structure employing clock buffer circuits in accordance with a specific embodiment of the present invention. In the clock distribution structure 80, a clock signal is applied at point 82. The signal propagates via points 84 and 86 to equivalent end points 88, 90, 92 and 94. At each equivalent endpoint 88, 90, 92, 94, a clock buffer circuit is employed. The propagation delays from point 82 to endpoints 88, 90, 92, 94 are all matched by matching distance and loadings for the clock driver at point 82.

Clock buffer circuits 96, 98, 100 and 102 are designed to present equal amounts of loading to the clock signals provided at points 88, 90, 92 and 94. Further, the design of the buffer circuits allows the circuits to drive unequal loads without affecting the loading seen by the clock signal. For example, clock buffer circuit 96 is configured to drive 100 relative units of loading 104, clock buffer circuit 98 is configured to drive 75 relative units of loading 106, clock buffer circuit 100 is configured to drive 50 relative units of loading 108, and clock buffer circuit 102 is configured to drive 25 relative units of loading 110.

One advantage of the present invention is that sub-block circuits may be changed during chip design, without requiring clock distribution to be recalculated or reconfigured on a structure-wide basis. In the circuit shown in FIG. 2, for example, if load 110 were redesigned to have 75 relative units of loading, the only change needed in the clock distribution structure would be to redesign the wiring of clock buffer 102 to drive 75 relative units of loading instead of 25 relative units. All other sub-blocks would be unaffected by such a change.

Figure 3:
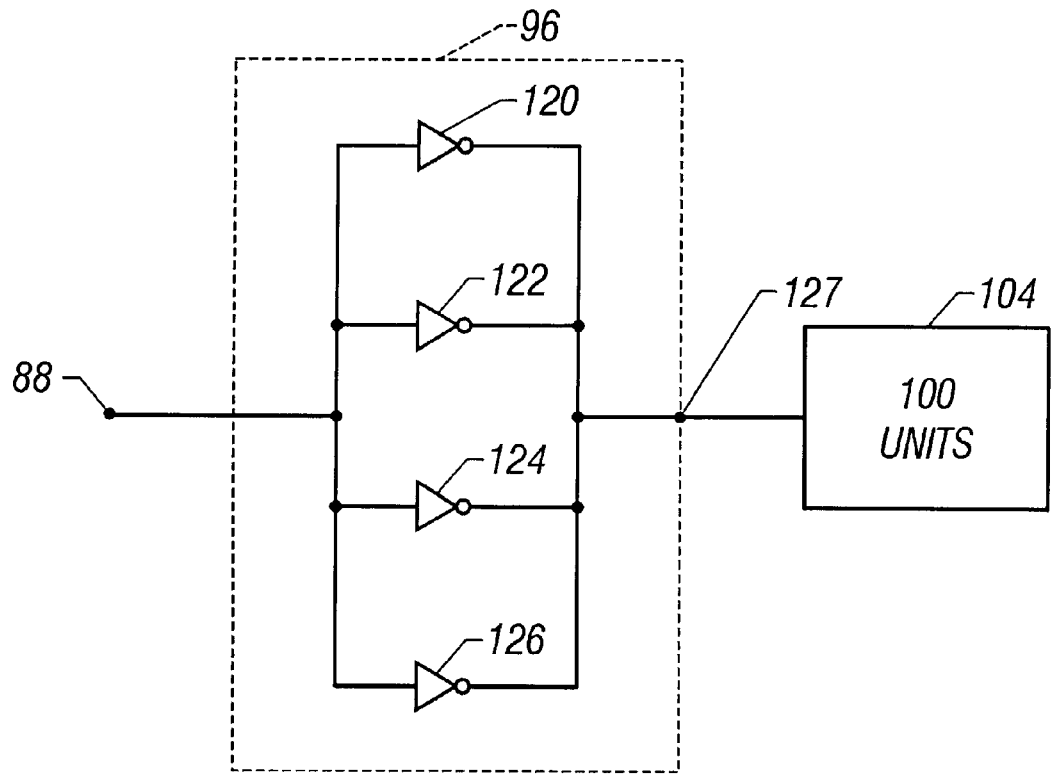
FIG. 3 is a schematic diagram of a clock buffer circuit in accordance with a specific embodiment of the present invention.

FIG. 3 is a schematic diagram of a clock buffer circuit in accordance with a specific embodiment of the present invention. The same clock buffer circuit 96 is also shown in FIG. 2. In the context of an entire H-tree clock distribution structure, clock buffer circuit 96 represents the configuration for driving the sub-block circuit having the greatest relative amount of loading in the structure.

Buffer circuit 96 comprises four inverters 120, 122, 124, 126 whose inputs are connected in parallel. These inverters may be referred to as driving inverters. When a clock signal is applied at point 88, the four inverters are all driven by the clock signal. Then, because the outputs of the four inverters are all connected in parallel to signal output 127, the entire output power of the buffer circuit 96 is applied from signal output 127 to the load 104.

Figure 4:
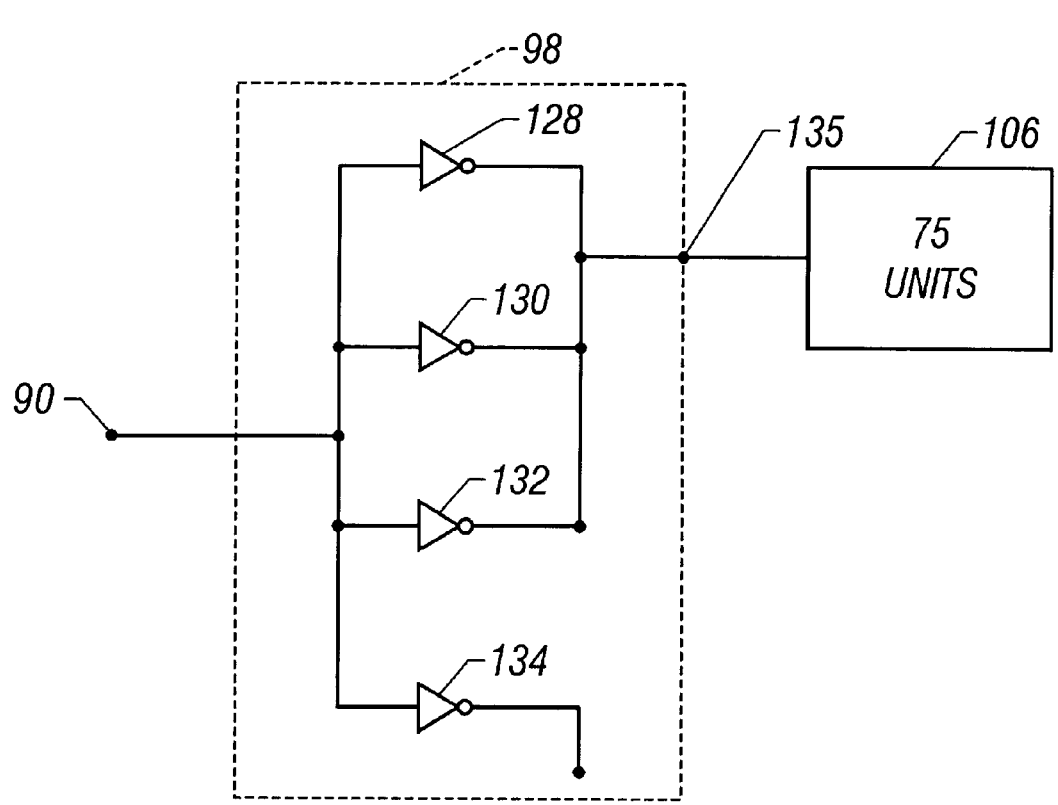
FIG. 4 is a schematic diagram of a clock buffer circuit in accordance with a specific embodiment of the present invention.

FIG. 4 is a schematic diagram of a clock buffer circuit in accordance with a specific embodiment of the present invention. The same clock buffer circuit 98 is also shown in FIG. 2. In the context of an entire H-tree clock distribution structure, clock buffer circuit 98 represents the configuration for driving the sub-block circuit having an amount of loading equal to three quarters (75%) of the greatest relative amount of loading in the structure.

Buffer circuit 98 comprises four inverters 128, 130, 132, 134 whose inputs are connected in parallel. When a clock signal is applied at point 90, the four inverters are all driven by the clock signal. Then, because the outputs of three of the four inverters are connected in parallel to signal output 135, three quarters (75%) of the output power of the buffer circuit 98 is applied from signal output 135 to the load 106. The output of fourth inverter 134, is wired to power and ground terminals without applying the power to the load 106. For detailed connectivity, refer to FIGS. 5 and 7.

By comparing FIG. 3 with FIG. 4, it is seen that both configurations of the buffer circuit present an equal amount of loading to the clock signals provided at points 88 and 90, respectively. Then, because buffer circuit 98 is configured to provide less driving current to a load than buffer circuit 96, unbalanced loads 104 and 106 receive the clock signal with minimal skew.

Referring back to FIG. 2, it is seen that the clock buffer circuit can be configured to provide low-skew clock signals to sub-blocks with varying amounts of loading. For example, clock buffer circuit 100 is configured to drive a sub-block with 50 relative units of loading since only two of four inverters are wired to provide power to the load 108. Similarly, clock buffer circuit 102 is configured to drive a sub-block with 25 relative units of loading since only one of four inverters is wired to provide power to the load 110.

Figure 5:
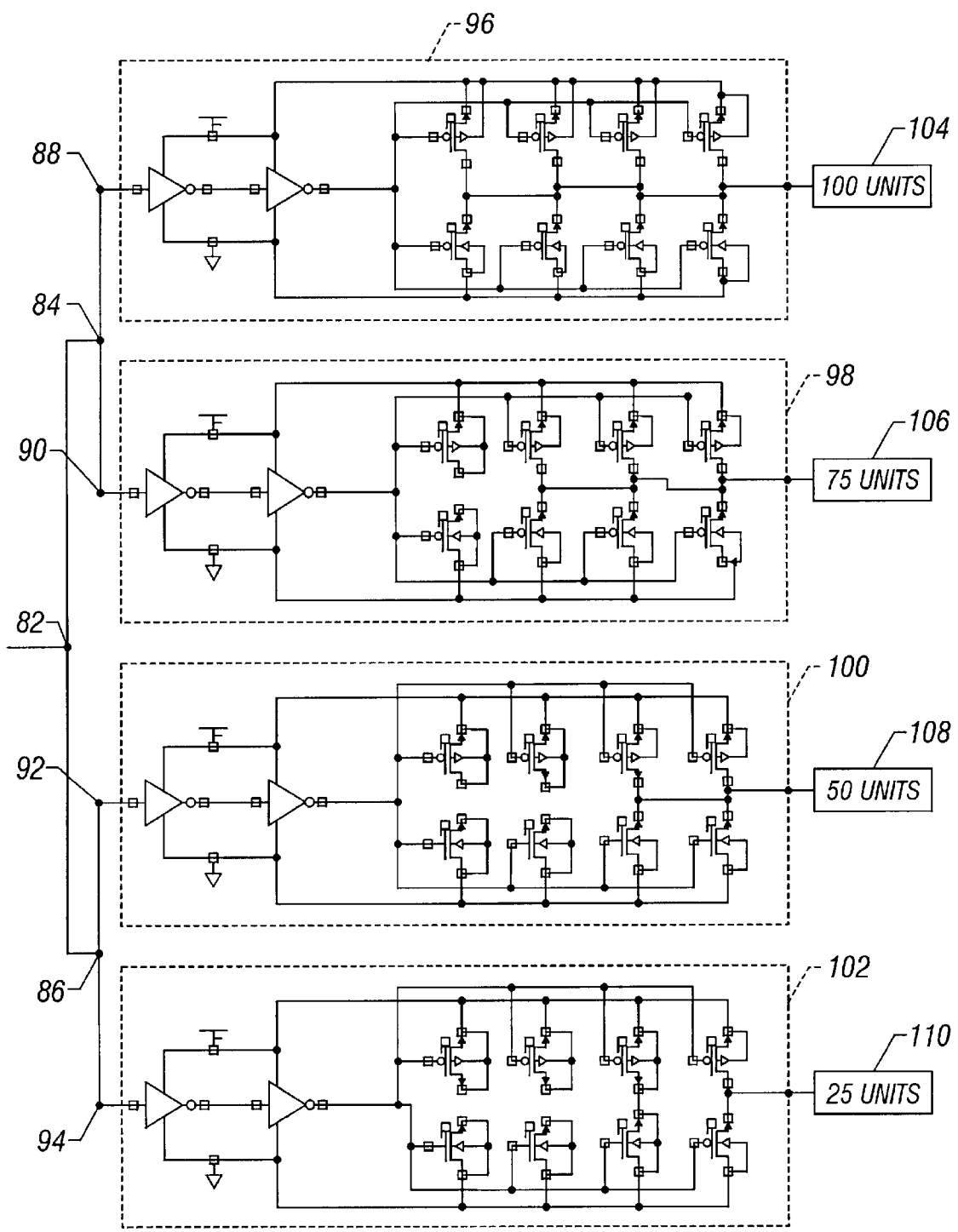
FIG. 5 is a schematic diagram of an H-tree clock distribution structure employing clock buffer circuits in accordance with a specific embodiment of the present invention.

FIG. 5 is a schematic diagram of an H-tree clock distribution structure employing clock buffer circuits in accordance with a specific embodiment of the present invention. FIG. 5 shows the same clock distribution structure shown in FIG. 2, with added details on the implementation of the clock buffer circuits.

Figure 6:
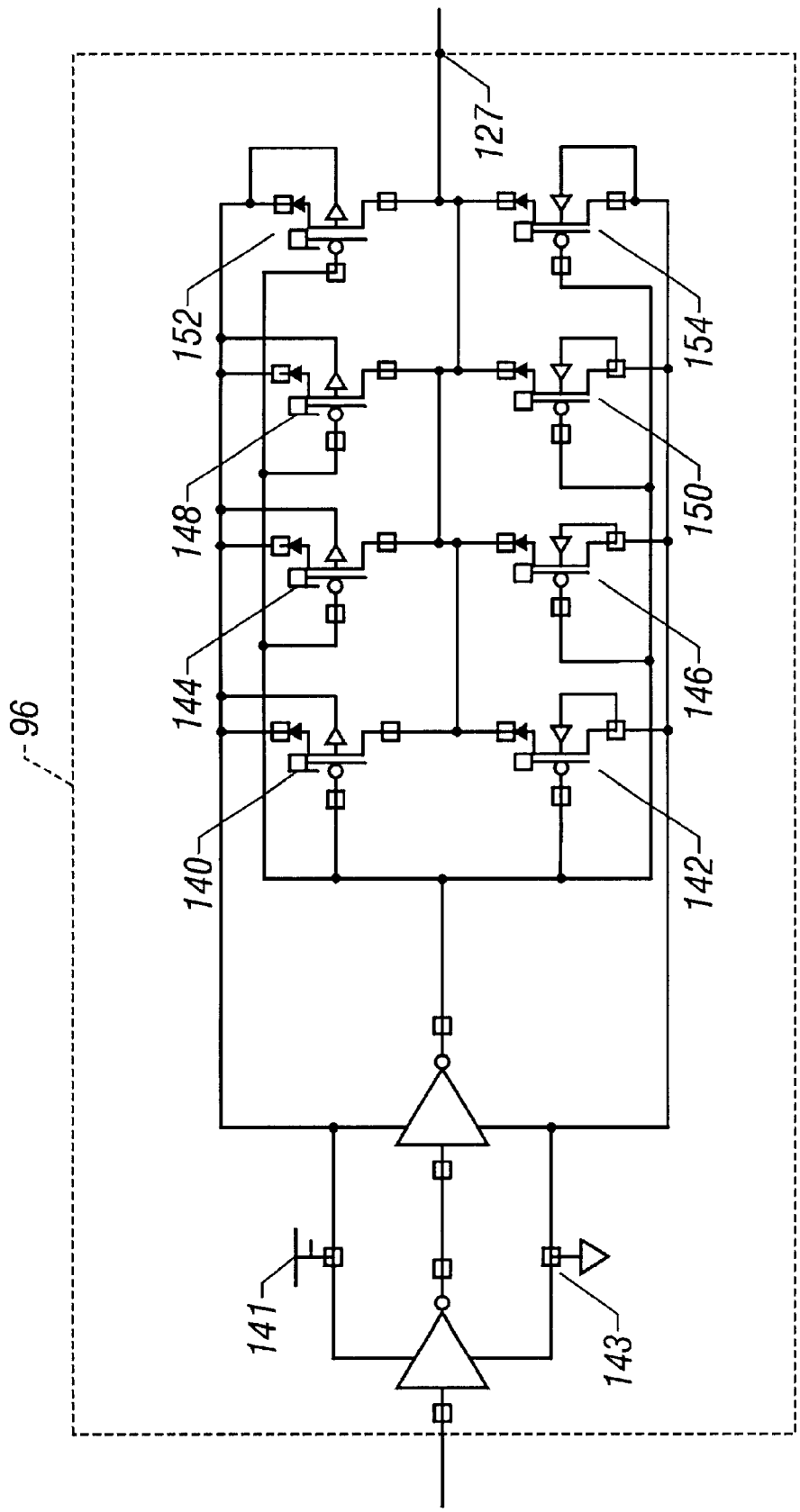
FIG. 6 is a detailed schematic diagram of a clock buffer circuit in accordance with a specific embodiment of the present invention.

FIG. 6 is a detailed schematic diagram of a clock buffer circuit in accordance with a specific embodiment of the present invention. The same clock buffer circuit 96 is also shown in FIGS. 2, 3 and 5. Buffer circuit 96 comprises four inverters whose inputs are connected in parallel. When a clock signal is applied, the four inverters are all driven by the clock signal. Then, because the outputs of the four inverters are all connected in parallel to signal output 127, the entire output current of the buffer circuit 96 is applied from signal output 127 to the load. The inverters are implemented in CMOS technology, and each inverter comprises a pMOS transistor paired with an nMOS transistor. In FIG. 6, pMOS transistor 140 and nMOS transistor 142 comprise one inverter, pMOS transistor 144 and nMOS transistor 146 comprise one inverter, pMOS transistor 148 and nMOS transistor 150 comprise one inverter, and pMOS transistor 152 and nMOS transistor 154 comprise one inverter.

As previously described, clock buffer circuit 96 represents the configuration for driving the sub-block circuit having the greatest amount of loading in the structure.

Clock buffer circuit 96 is connected to $V_{dd}$ (typically in a range of about 1.2 to about 5 volts) at point 141 and $V_{SS}$ (ground) at point 143. Clock buffer circuit 96 also comprises a pre-driver section having two inverters.

Figure 7:
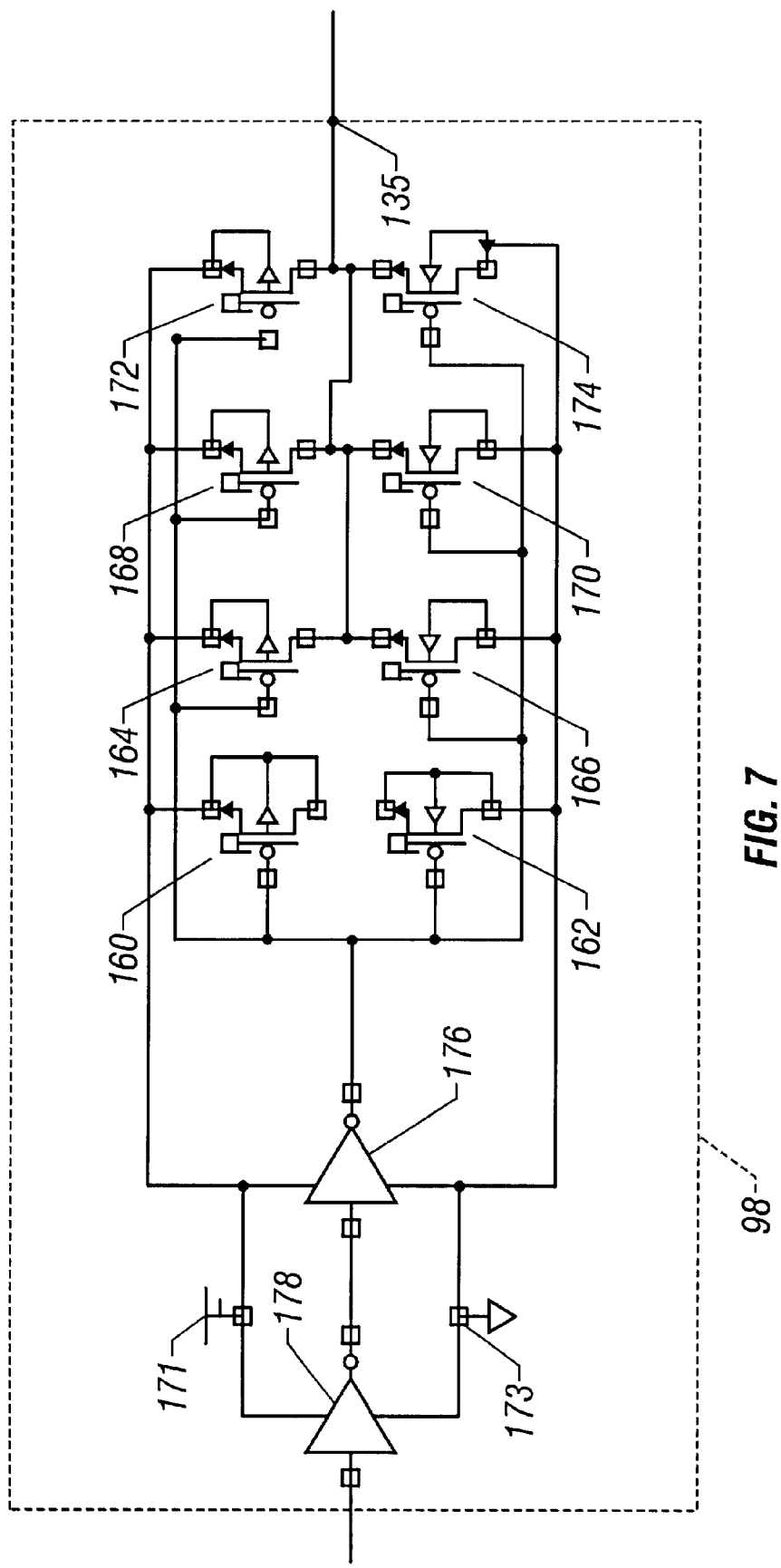
FIG. 7 is a detailed schematic diagram of a clock buffer circuit in accordance with a specific embodiment of the present invention.

FIG. 7 is a detailed schematic diagram of a clock buffer circuit in accordance with a specific embodiment of the present invention. The same clock buffer circuit 98 is also shown in FIGS. 2, 4 and 5. Buffer circuit 98 comprises four inverters whose inputs are connected in parallel. When a clock signal is applied, the four inverters are all driven by the clock signal. Then, because the outputs of three of the four inverters are connected in parallel to signal output 135, 75% of the output power of the buffer circuit 98 is applied from signal output 135 to the load. The inverters are implemented in CMOS technology, and each inverter comprises a pMOS transistor paired with an nMOS transistor. In FIG. 7, pMOS transistor 160 and nMOS transistor 162 comprise one inverter, pMOS transistor 164 and nMOS transistor 166 comprise one inverter, pMOS transistor 168 and nMOS transistor 160 comprise one inverter, and pMOS transistor 162 and nMOS transistor 164 comprise one inverter.

As previously described, clock buffer circuit 98 represents the configuration for driving the sub-block circuit having a relative loading of 75 units, such loading approximating 75% of the greatest relative amount of loading of a sub-block in the structure.

Buffer circuit 98 comprises four inverters whose inputs are connected in parallel. Clock buffer circuit 98 is connected to $V_{dd}$ (typically in a range of about 1.2 to about 5 volts) at 171 and $V_{SS}$ (ground) at 173. Clock buffer circuit 98 also comprises a pre-driver section having two inverters 176, 178. When a clock signal is applied, the four inverters are driven by the predriver. Then, because the outputs of three of the four inverters are connected in parallel, 75% of the output power of the buffer circuit 98 is applied to the load. The output of the inverter comprised of FETs 160 and 162 is wired to power or ground, depending upon the type of FET, without driving the load. The output of pMOS transistor 160 is wired to $V_{dd}$ and the output of nMOS transistor is wired to $V_{SS}$. Therefore, there is no power consumption associated with the output of FETs 160 and 162.

Generally, clock buffer circuits of the present invention are comprised of a plurality of inverters whose inputs are connected in parallel. Depending on the relative loading of the sub-block which the buffer circuit is driving, a plurality of the inverters are wired to drive the sub-block circuit and the remaining inverters are wired to power or ground, thereby dissipating no power.

In the example shown in FIG. 2, clock buffer circuits having four inverters are illustrated. Such a clock buffer circuit can be configured to drive sub-block circuits approximating 25%, 50%, 75% or 100% of sub-block loading relative to the sub-block having the greatest amount of loading in the clock distribution structure.

It will be appreciated that more or less granularity can be applied to the loading ranges by varying the number of inverters in the clock buffer circuit. For example, a clock buffer circuit having three inverters can be configured to drive sub-block circuits approximating 33%, 67% or 100% of sub-block loading relative to the sub-block having the greatest amount of loading in the clock distribution structure. In another example, a clock buffer circuit having five inverters can be configured to drive sub-block circuits approximating 20%, 40%, 60%, 80% or 100% of sub-block loading relative to the sub-block having the greatest amount of loading in the clock distribution structure.

In one embodiment, all clock buffer circuits in a clock distribution structure may have the same number of inverters. In this embodiment, all sub-blocks would present the same amount of loading to the clock signals at the inputs to the sub-blocks. However, clock distribution structures may be designed to provide low-skew clock signals to clock buffer circuits presenting differing amounts of loading. In such a case, sub-blocks could have differing numbers of inverters in their clock buffer circuits.

Relative sub-block loading need not exactly match the relative power output of a clock buffer circuit. For example, if the clock buffer circuit in the sub-block with the greatest relative loading is driving 100 loading units powered by four out of four inverters, a sub-block with 45 loading units might employ a clock signal powered by two out of four inverters in its clock buffer circuit without introducing excessive skew.

Up to this point in the description, it has been assumed that all the inverters in a clock buffer are of equal size, i.e., all inverters present an equal load and provide an equal amount of current. However, it will be appreciated that the present invention may be practiced with inverters of unequal sizes. In such a case, output current of a clock buffer circuit divided by its maximum potential current (all inverters wired to drive the load) will still approximate the loading of its sub-block divided by the loading of the sub-block having the greatest amount of loading in the structure.

In clock buffers structures of the present invention, dummy loads may be added to sub-blocks to increase the accuracy of the approximation between the output current drivability of a clock buffer circuit divided by its maximum potential current and the loading of its sub-block divided by the loading of the sub-block having the greatest amount of loading in the structure. Table 1 describes a situation where such dummy loads may be added to a sub-block where sub-block does not have the greatest amount of loading in the structure.

TABLE 1

| Sub-block # | loading required by sub-block circuit | dummy loads | total loading of sub-block | inverters wired to power sub-block |
|---|---|---|---|---|
| 1 | 100 | 0 | 100 | 4/4 |
| 2 | 70 | 5 | 75 | 3/4 |
| 3 | 50 | 0 | 50 | 2/4 |
| 4 | 67 | 8 | 75 | 1/4 |

Table 2 describes a situation where such dummy loads are added to a sub-block where there sub-block has the greatest amount of loading in the structure.

TABLE 2

| Sub-block # | loading required by sub-block circuit | dummy loads | total loading of sub-block | inverters wired to power sub-block |
|---|---|---|---|---|
| 1 | 90 | 10 | 100 | 4/4 |
| 2 | 75 | 0 | 75 | 3/4 |
| 3 | 50 | 0 | 50 | 2/4 |
| 4 | 75 | 0 | 75 | 1/4 |

Table 3 describes a situation where such dummy loads are added both to a sun-block where there sub-block does not have the greatest amount of loading in the structure, and to a sub-block where there sub-block has the greatest amount of loading in the structure.

TABLE 3

| Sub-block # | loading required by sub-block circuit | dummy loads | total loading of sub-block | inverters wired to power sub-block |
|---|---|---|---|---|
| 1 | 93 | 7 | 100 | 4/4 |
| 2 | 70 | 5 | 75 | 3/4 |
| 3 | 50 | 0 | 50 | 2/4 |
| 4 | 67 | 8 | 75 | 1/4 |

Figure 8:
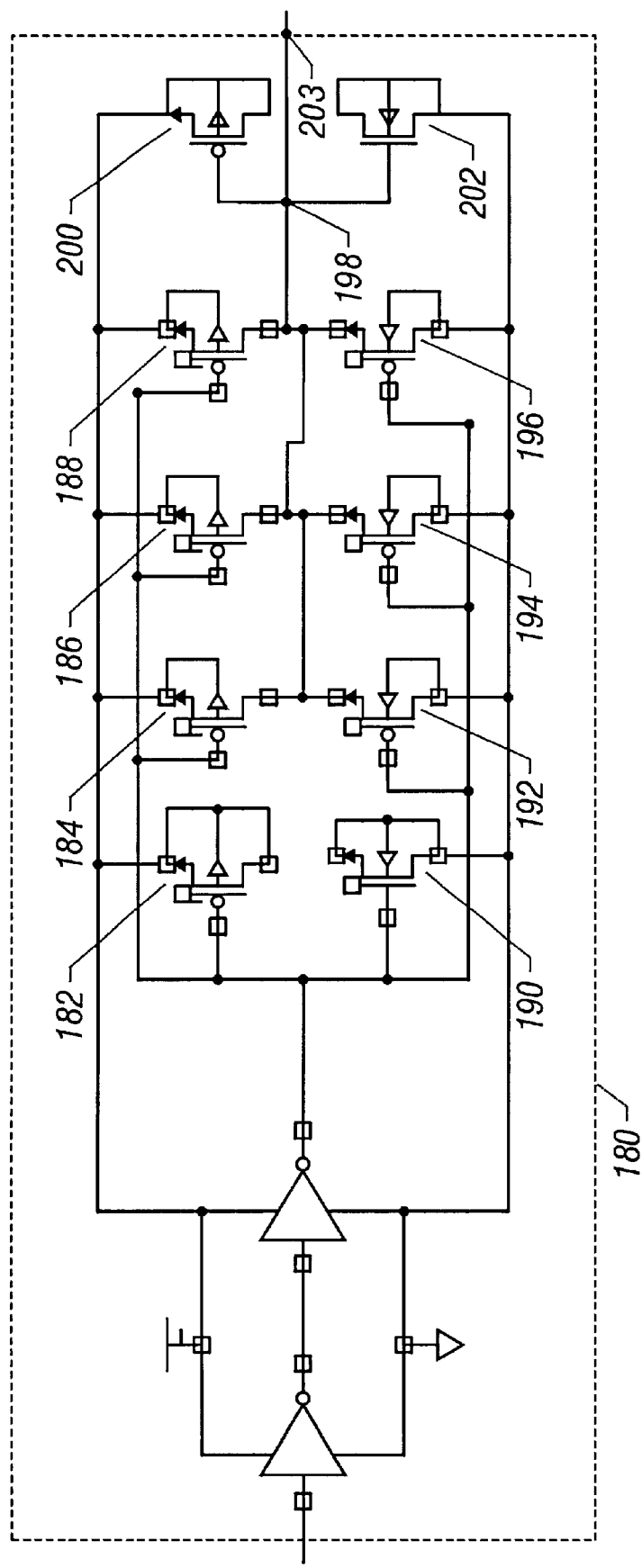
FIG. 8 is a schematic diagram showing an efficient method and apparatus for adding dummy loads to a clock buffer circuit according to a specific embodiment of the present invention.

FIG. 8 is a schematic diagram showing an efficient method and apparatus for adding dummy loads to a clock buffer circuit according to a specific embodiment of the present invention. Clock buffer circuit 180 comprises pMOS FETs 182, 184, 186, 188 and nMOS FETs 190, 192, 194 and 196. These transistors provide an output clock signal at 198. If dummy loads are desired, pMOS FET 200 and nMOS FET 202 may be included in the clock buffer circuit. It can be seen from the schematic that FETs 200 and 202 provide a dummy load that attenuates the power that is received by signal output 203. The size of FETs 200 and 202 may be varied according to the amount of dummy loading required. If no dummy loading is required, FETs 200 and 202 may be omitted from the buffer circuit by connecting the gates to power and ground terminals. However, by reserving space in each clock buffer circuit for one or more pairs of dummy load FETs during initial circuit design, a designer may provide for flexibility later in the design process. Further, the circuit design is simplified by including all dummy loads at known locations within the clock buffer circuits.

Dummy loads may be designed to comprise a single pMOS FET, multiple pMOS FETs, a single nMOS FET, multiple NMOS FETS, or any combination thereof. For example, a circuit using a single nMOS FET as a dummy load would be identical to FIG. 8, except that pMOS transistor 202 would be deleted from the circuit. As another example, a circuit using a single pMOS FET as a dummy load would be identical to FIG. 8, except that nMOS transistor 200 would be deleted from the circuit.

For clock buffer circuits with higher loading capacitance, fast switching of output inverter stages may introduce switching noise due to the displacement current which flows from power supply to ground nodes in an integrated circuit when both pMOS and nMOS transistors are on. Also, Miller effect noise from coupling parasitic capacitances between control signals and output nodes is undesirable. For example, the clock buffer circuit shown in FIG. 6 could be further improved by reducing these problems.

Figure 9:
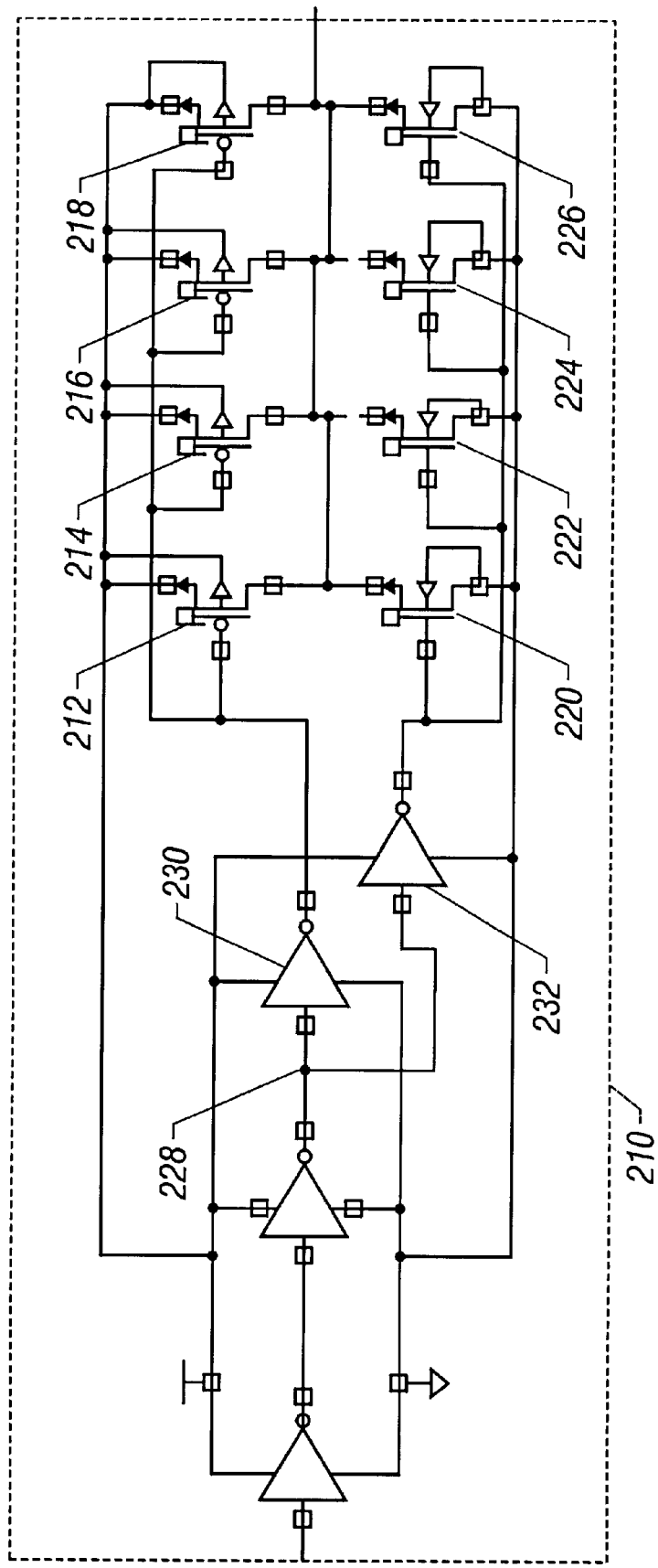
FIG. 9 is a schematic diagram showing a method and apparatus for reducing switching noise and Miller effect noise in a clock buffer circuit according to a specific embodiment of the present invention.

FIG. 9 is a schematic diagram showing a method and apparatus for reducing switching noise and Miller effect noise in a clock buffer circuit according to a specific embodiment of the present invention. Clock buffer circuit 210 comprises pMOS FETs 212, 214, 216, 218 and nMOS FETs 220, 222, 224 and 226. In the pre-driver section of clock buffer circuit 210, the clock signal is split at point 228 and provided in parallel to inverters 230 and 232. Inverter 230 then drives pMOS FETs 212, 214, 216 and 218 while inverter 232 drives nMOS FETs 220, 222, 224 and 226. By providing separate pre-driving signals for the nMOS FETs from the pMOS FETS, both switching noise and Miller effect are reduced.

In this invention, a clock buffer circuit provides a clock signal to a first sub-block of a clock distribution structure. The clock distribution structure has a plurality of sub-blocks. Each of the sub-blocks has an amount of loading. A second sub-block has the greatest amount of loading of any of the plurality of sub-blocks. The circuit comprises a plurality of inverters with inputs connected in parallel and a signal output connected to the first sub-block. The output receives the combined signals from a portion of the plurality of inverters. The portion is approximated by the amount of loading of the first sub-block divided by the amount of loading of the second sub-block. The power output of the remaining inverters is wired to power and ground without driving the first sub-block.

In the clock buffer circuit, each driving inverter may comprise a pMOS FET and an NMOS FET. The circuit may further comprise a dummy load. The dummy load may comprise a pMOS FET and an nMOS FET. The clock buffer circuit may be included in an H-tree clock distribution structure.

A variation of the clock buffer circuit provides a clock signal to a first sub-block of a clock distribution structure. The clock distribution structure has a plurality of sub-blocks. Each of the sub-blocks has an amount of loading and the first sub-block has the greatest amount of loading of any of the plurality of sub-blocks. The circuit comprises a plurality of inverters with inputs connected in parallel and a signal output connected to said first sub-block. The signal output receives the combined signals from all of the plurality of inverters.

In the clock buffer circuit, each inverter may comprises a pMOS FET and an nMOS FET. The circuit may further comprise a dummy load. The dummy load may comprises a pMOS FET and an nMOS FET. The clock buffer circuit may be included in an H-tree clock distribution structure.

The invention also includes a method for reducing clock signal skew in an integrated circuit by providing a clock distribution structure having a plurality of sub-blocks. Each of the plurality of sub-blocks has an amount of loading. A clock buffer circuit is provided at each sub-block. Each clock buffer circuit has a plurality of inverters with parallel inputs and a signal output.

The sub-block having the greatest amount of loading is determined. The clock buffer circuit in the sub-block having the greatest amount of loading is connected such that the signal output receives the combined signals from all of said plurality of inverters.

The clock buffer circuit in every other sub-block is connected such that the signal output receives the combined signals from a portion of said plurality of inverters. Each portion is approximated by the amount of loading of the sub-block divided by the amount of loading of the sub-block having the greatest amount of loading. The output of the remaining inverters is wired to power and ground without driving the sub-block.

The method may further comprise adjusting the amount of loading in a sub-block by adding a dummy load to a clock buffer circuit. Such adjusting may comprise varying the sizes of a pMOS FET and an nMOS FET to provide a dummy load of a suitable size. Since dummy loads can be implemented in various ways as described above, such adjusting at least comprises varying the size of an FET.

A clock buffer circuit providing a clock signal with reduced noise has a driver section having a plurality of driving inverters and a pre-driver section. The driving inverters each comprise a pMOS FET paired with an nMOS FET. The pre-driver comprises a first pre-driver inverter driving all pMOS FETs in the driver section and a second pre-driver inverter driving all nMOS FETs in the driver section. The input to the first pre-driver inverter and the input to the second pre-driver inverter are connected in parallel.

A method of reducing noise in a clock buffer circuit comprises providing a clock buffer circuit having a driver section. The driver section has a plurality of driving inverters. Each of the driving inverters comprise a pMOS FET paired with an nMOS FET. A first pre-driver inverter is provided. The first pre-driver inverter drives all the pMOS FETs in the driver section. A second pre-driver inverter is provided. The second pre-driver inverter drives all the nMOS FETs in the driver section. The input to the first pre-driver inverter and the input to the second pre-driver inverter are connected in parallel.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A clock buffer circuit providing a clock signal to a first sub-block of a clock distribution structure, said structure having a plurality of sub-blocks, where each of said sub-blocks has an amount of loading and a second sub-block has the greatest amount of loading of any of the plurality of sub-blocks, the circuit comprising:
   a plurality of inverters with inputs connected in parallel; and
   a signal output connected to said first sub-block, said signal output receiving the combined signals from a portion of the plurality of inverters, said portion approximated by the amount of loading of the first sub-block divided by the amount of loading of the second sub-block, where the output power of the remaining inverters is wired to power and ground without driving the first sub-block.

2. The circuit of claim 1, where each inverter comprises a pMOS FET and an nMOS FET.

3. The circuit of claim 1, further comprising a dummy load.

4. The circuit of claim 3, where the dummy load comprises an FET.

5. The circuit of claim 1, where the clock distribution structure is a H-tree.

6. A clock buffer circuit providing a clock signal to a first sub-block of a clock distribution structure, said structure having a plurality of sub-blocks, where each of said sub-blocks has an amount of loading and said first sub-block has the greatest amount of loading of any of the plurality of sub-blocks, the circuit comprising:

a dummy load;

a plurality of inverters with inputs connected in parallel; and a signal output connected to said first sub-block, said signal output receiving the combined signals from all of the plurality of inverters.

7. The circuit of claim 6, where each inverter comprises a pMOS FET and an nMOS FET.

8. The circuit of claim 6, where the dummy load comprises an FET.

9. The circuit of claim 6, where the clock distribution structure is a H-tree.

10. A method for reducing clock signal skew in an integrated circuit, the method comprising:

providing a clock distribution structure having a plurality of sub-blocks, each of said plurality of sub-blocks having an amount of loading;

providing a clock buffer circuit at each sub-block, said clock buffer circuit having a plurality of inverters with parallel inputs and a signal output;

determining which sub-block has the greatest amount of loading;

connecting the clock buffer circuit in the sub-block having the greatest amount of loading such that the signal output receives the combined signals from all of said plurality of inverters; and connecting the clock buffer circuit in every other sub-block such that the signal output receives the combined signals from a portion of said plurality of inverters, said portion approximated by the amount of loading of the sub-block divided by the amount of loading of the sub-block having the greatest amount of loading, where the output of the remaining inverters is wired to power and ground without driving the sub-block.

11. The method of claim 10, further comprising:

adjusting the amount of loading in a sub-block by adding a dummy load to a clock buffer circuit.

12. The method of claim 11, where such adjusting comprises:

varying the sizes of an FET to provide a dummy load of a suitable size.

13. The circuit of claim 2, further comprising a pre-driver comprising:

a first pre-driver inverter for driving all pMOS FETs in said circuit; and a second pre-driver inverter for driving all nMOS FETs in said circuit;

where the input of the first pre-driver inverter and the input of the second pre-driver inverter are connected in parallel.

14. The circuit of claim 7, further comprising a pre-driver comprising:

a first pre-driver inverter for driving all pMOS FETs in said circuit; and a second pre-driver inverter for driving all nMOS FETs in said circuit;

where the input of the first pre-driver inverter and the input of the second pre-driver inverter are connected in parallel.

15. The method of claim 10, wherein each of said plurality of inverters in at least one of said clock buffer circuits comprises a pMOS FET paired with an nMOS FET, the method further comprising:

providing a first pre-driver inverter for driving all pMOS FETs in said at least one clock buffer circuit; and providing a second pre-driver inverter for driving all nMOS FETs in said at least one clock buffer circuit;

where the input to the first pre-driver inverter and the input to the second pre-driver inverter are connected in parallel.

* * * * *